United States Patent [19]

Schildkraut et al.

[11] Patent Number: 4,999,809

[45] Date of Patent: Mar. 12, 1991

[54] PHOTOREFRACTIVE DEVICE AND PROCESS FOR ITS USE

[75] Inventors: Jay S. Schildkraut; Ralph H. Young, both of Rochester; David J. Williams, Fairport; Michael Scozzafava, Rochester, all of N.Y.

[73] Assignee: Eastman Kodak Company, Rochester, N.Y.

[21] Appl. No.: 491,398

[22] Filed: Mar. 9, 1990

[51] Int. Cl.$^5$ .............................................. G11C 13/00
[52] U.S. Cl. ..................... 365/106; 365/120; 365/124; 365/127; 430/20
[58] Field of Search .............. 365/106, 119, 120, 121, 365/124, 127; 430/20; 369/100

[56] References Cited

U.S. PATENT DOCUMENTS 4,819,210  4/1989  Miura et al. ....................... 365/106

OTHER PUBLICATIONS

Chapter 11, "Optical Phase Conjugation in Photorefractive Materials", *Optical Phase Conjugation*, Academic Press, 1983, pp. 417-425.
G. Moddel, K. M. Johnson, W. Li, and R. A. Rice, "High Speed Binary Optically Addressed Spatial Light Modulator", *Appl. Phys. Lett.*, vol. 55, No. 6, Aug. 7, 1989, pp. 537-539.
E. M. Yeatman and M. E. Caldwell, "Spatial Light Modulation Using Plasmon Resonance", *Appl. Phys. Lett.*, vol. 55, No. 7, Aug. 14, 1989, pp. 613-615.
R. Lytel, F. G. Lipscomb, J. Thackara, J. Altman, P. Elizondo, M. Stiller and B. Sullivna, "Nonlinear and Electro-Optic Organic Devices", pp. 415-426, *Nonlinear Optical and Electroactive Polymers* (P. N. Prasad and D. R. Ulrich, Editors), Plenum Press, N.Y., 1988.
D. J. Williams, "Organic Polymeric and Non-Polymeric Materials with Large Optical Nonlinearities", *Angew. Chem. Int. Ed. Engl.* 23, (1984), pp. 690-703.

*Primary Examiner*—Terrell W. Fears
*Attorney, Agent, or Firm*—Carl O. Thomas

[57] ABSTRACT

A photorefractive device is disclosed comprised of a first and second electrodes for establishing a potential gradient between first and second spaced locations and, interposed between the first and second electrodes, intermediate means capable of producing in a readout beam of electromagnetic radiation an image pattern corresponding to that present in a spatially intersecting writing beam of electromagnetic radiation when a potential gradient is applied to the intermediate means by said first and second electrodes. The intermediate means consists of a photorefractive layer capable of internally storing the image pattern of the writing beam created by its interference with an intersecting reference beam of electromagnetic radiation, the photorefractive layer being comprised of a homogeneous organic photoconductor containing organic noncentrosymmetric molecular dipoles capable of imparting to the photorefractive layer a second order polarization susceptibility of greater than $10^{-9}$ esu.

24 Claims, 2 Drawing Sheets

PHOTOREFRACTIVE DEVICE AND PROCESS FOR ITS USE

FIELD OF THE INVENTION

The invention relates to a device for modulating electromagnetic radiation. More specifically, the invention relates to a device for modulating electromagnetic radiation from one source in response to electromagnetic radiation from another source.

BACKGROUND OF THE INVENTION

With increasing interest in employing light for information transfer theoretically useful models of spatial light modulators (commonly referred to as SLM's) have been proposed.

It has been observed that light being transmitted through a medium can be modulated by spatially intersecting light from a second source when the medium exhibits a refractive index that can be varied in response to light transmission. By "spatially intersecting" it is meant that light from the separate sources traverses intersecting paths, but not necessarily within overlapping time periods. The effect, referred to as a photorefractive effect, was first observed in working with lithium niobate (LN), lithium tantalum niobate (LTN), and potassium tantalum niobate (KTN) crystals intended for second harmonic generation (SHG) applications. Observations of photorefractive effects allowing holographic images to be stored in LN and KTN are reported in Chapter 11, Optical Phase Conjugation in Photorefractive Materials, *Optical Phase Conjugation*, Academic Press, 1983, pp. 417–425.

G. Moddel, K. M. Johnson, W. Li, and R. A. Rice, "High Speed Binary Optically Addressed Spatial Light Modulator", *Appl. Phys. Lett.*, Vol. 55, No. 6, Aug. 7, 1989, pp. 537–539, illustrate a photorefractive light modulating device which employs liquid crystals as a photorefractive material. Although Moddel suggests that the ferromagnetic liquid crystals employed represent an improvement in terms of switching speeds over nematic liquid crystals, the fact is that all liquid crystal photorefractive devices are inherently limited in their frequency response, since the entire liquid crystal molecule must change its orientation to effect switching.

Another significant disadvantage of liquid crystals employed to provide photorefractive effects is that separate aligning layers must be provided above and below the liquid crystal layer to achieve the best attainable response. This involves constructing three separate layers and is consequently a fabrication disadvantage. The use of a liquid crystal layer between alignment layers is illustrated by E. M. Yeatman and M. E. Caldwell, "Spatial Light Modulation Using Surface Plasmon Resonance", *Appl. Phys. Lett.*, Vol. 55, No. 7, Aug. 14, 1989, pp. 613–615.

R. Lytel, F. G. Lipscomb, J. Thackara, J. Altman, P. Elizondo, M. Stiller and B. Sullivan, "Nonlinear and Electro-Optic Organic Devices", pp. 415–426, *Nonlinear Optical and Electroactive Polymers* (P. N. Prasad and D. R. Ulrich, editors), Plenum Press, N.Y., 1988, disclose in FIG. 1 at page 419 a spatial light modulator comprised of a photodiode for receiving modulating light, a light blocking layer, a dielectric mirror, an electro-optic crystal and a transparent electrode for external circuit connection to the photodiode. While it is speculated that organic electro-optic materials might be substituted for the electro-optic crystal, the device even when so modified remains quite complicated to construct and limited in potential configurations because of the photodiode addressing required.

D. J. Williams, "Organic Polymeric and Non-Polymeric Materials with Large Optical Nonlinearities", *Angew. Chem. Int. Ed. Engl.* 23, (1984) 690–703, illustrates the known relationships between polarization properties and organic molecular dipoles.

SUMMARY OF THE INVENTION

It is an object of this invention to provide a photorefractive device for modulating one source of electromagnetic radiation with another wherein the device can be highly efficient while also offering construction advantages and geometrical flexibility in form.

In one aspect this invention is directed to a photorefractive device comprised of first and second electrical biasing means for establishing a potential gradient between first and second spaced locations and, interposed between the first and second electrical biasing means, intermediate means capable of producing in a readout beam of electromagnetic radiation an image pattern corresponding to that present in a spatially intersecting writing beam of electromagnetic radiation when a potential gradient is applied to the intermediate means by the first and second electrical biasing means.

The invention is characterized in that the intermediate means consists of a photorefractive layer capable of internally storing the image pattern of the writing beam created by its interference with an intersecting reference beam of electromagnetic radiation, the photorefractive layer being comprised of a homogeneous organic photoconductor containing organic noncentrosymmetric molecular dipoles capable of imparting to the photorefractive layer a second order polarization susceptibility of greater than $10^{-9}$ esu, the molecular dipoles each containing an electron donor moiety linked through a conjugated $\pi$ bonding system to an electron acceptor moiety.

It is another object of this invention to provide a process of efficiently transferring information from one source of electromagnetic radiation to another source of electromagnetic radiation.

This object is achieved by a process of transferring information from one source of electromagnetic radiation to another comprising transferring information contained in a modulated source of electromagnetic radiation to a photorefractive device and addressing the photorefractive device with a source of electromagnetic radiation to be modulated in order to achieve information transfer from the modulated source of electromagnetic radiation to the source of radiation to be modulated. This process is characterized in that the photorefractive device of the invention is employed.

DESCRIPTION OF PREFERRED EMBODIMENTS

Figure 1:
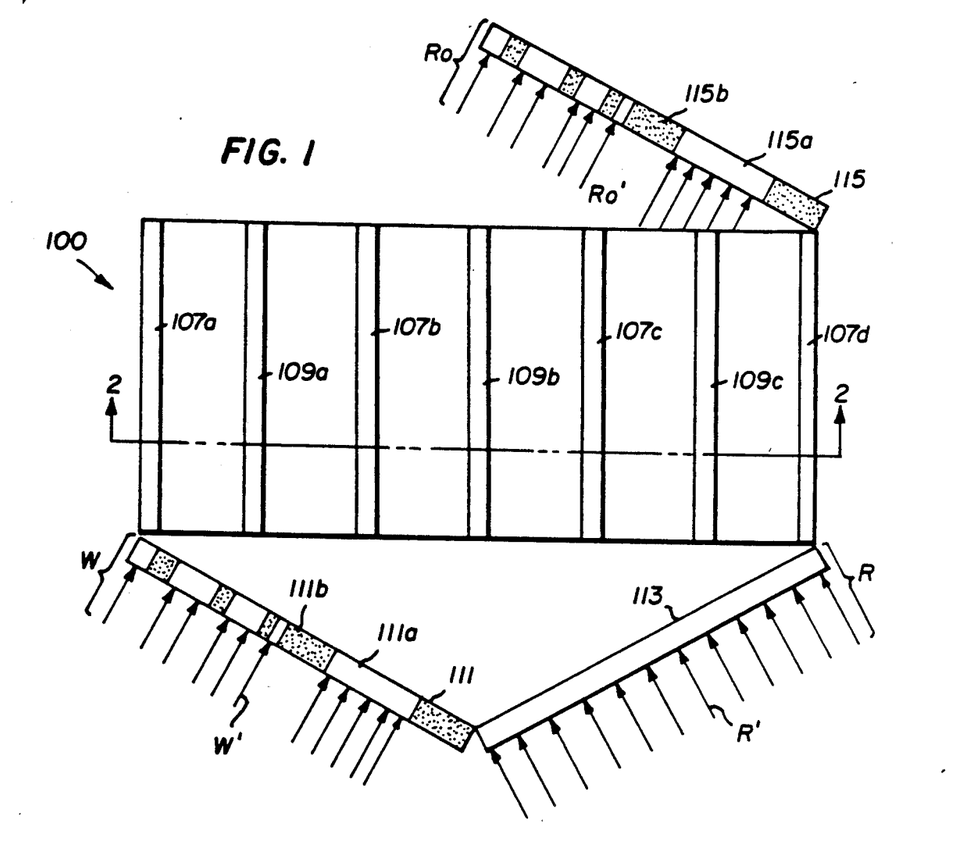
FIG. 1 is a plan view of a photorefractive device according to the invention.
Figure 2:
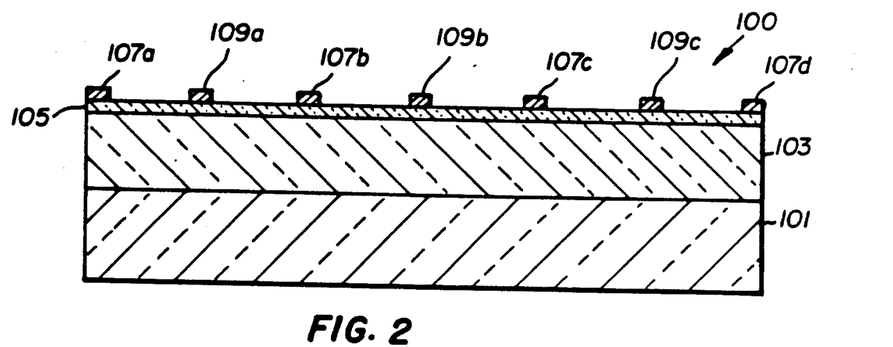
FIG. 2 is a sectional view taken along section line 2—2 in FIG. 1.

A photorefractive device 100 satisfying the requirements of the invention is shown in FIGS. 1 and 2. The device as shown consists of a transparent support 101 onto which is coated a photorefractive layer 103 capable of exhibiting a second order polarization susceptibility $\chi^{(2)}$ of greater than $10^{-9}$ electrostatic units. The layer 103 is a charge neutral organic photoconductor capable of being rendered photorefractive by organic noncentrosymmetric molecular dipoles each containing an electron donor moiety linked through a conjugated $\pi$ bonding system to an electron acceptor moiety. Contiguously overlying the photorefractive layer and in contact with it is a transparent dielectric cladding layer 105. Each of the transparent support and cladding layers is chosen to have an index of refraction less than that of the photorefractive layer. Overlying the cladding layer is a first electrode which, as shown, is divided into laterally spaced segments 107a, 107b, 107c and 107d. A second electrode also overlies the cladding layer and, as shown, is divided into laterally spaced segments 109a, 109b and 109c interposed between and laterally spaced from adjacent segments of the first electrode.

In operation, a potential gradient is applied to the device by electrically biasing the first and second electrodes so that a potential gradient is established between adjacent segments of the first and second electrodes. For example, a potential gradient is established between first electrode segment 107a and second electrode segment 109a, a similar but oppositely oriented potential gradient is established between second electrode segment 109a and first electrode segment 107b, etc.

The organic molecular dipoles in the photorefractive layer are in polar alignment with the electric fields established between adjacent pairs of electrode segments. The organic molecular dipoles can, if desired, be brought into polar alignment as or immediately before the device is electrically biased for use. In most instances the organic molecular dipoles are polar aligned when the device is initially formed by employing any convenient conventional poling technique. It should be noticed that the electrical biasing of electrodes employed in device operation is also used for poling and therefore in device operation reinforces the polar alignment of the organic molecular dipoles and minimize any diminution of polarization occurring between device construction and use.

With the potential gradient applied, an information bearing (i.e., writing) source of electromagnetic radiation W is directed through the photorefractive layer 103. The arrows W' show the direction of the writing radiation while the bar 111 schematically shows an exemplary profile of writing radiation, where light areas 111a indicate transmission of writing radiation and dark areas 111b indicate the absence of writing radiation.

Concurrently with directing the writing radiation into the photorefractive layer a reference beam of electromagnetic radiation R is directed into the photorefractive layer. The direction of the reference radiation is indicated by arrows R' while the bar 113 schematically shows a uniform profile of the reference beam.

The writing and reference beams of electromagnetic radiation are oriented to intersect spatially within the photorefractive layer. Their intersection creates an interference grating. That is, the wavefronts will at spaced locations cancel each other so that the photorefractive layer sees little or no net electromagnetic radiation at these points while at other spaced locations the wavefronts reinforce each other so that the photorefractive layer sees a significantly larger intensity of electromagnetic radiation than that provided by either beam alone. In the spaced areas of intersecting wavefront reinforcement the organic photoconductor forming the photorefractive layer responds to the locally increased electromagnetic radiation intensity by becoming more conductive. This locally changes the potential gradient and space charge in the photorefractive layer. When the potential gradient is locally altered, the polar aligned organic molecular dipoles correspondingly locally alter the refractive index of the photorefractive layer. Thus, an interference grating of differing refractive indices is created in the photorefractive layer by the intersecting writing and reference beams.

The interference grating created within the photorefractive layer by the intersection of the writing and reference beams constitutes a transfer of the image information contained in the writing beam to the photorefractive device. After the interference grating of differing refractive indices has been created in the photorefractive layer, the information in the writing beam can be read out of the device merely by again applying the reference beam in the absence of the writing beam. When this is undertaken, a readout beam RO is generated by introducing the reference beam R alone. The arrows RO' indicate the orientation of the output beam. Notice that the internal local differences in the refractive index of the photorefractive layer have deflected the reference beam from its original orientation, indicated by arrows R' to the direction of the writing beam W'. The bar 115 schematically shows the pattern of the readout beam, where light areas 115a indicate transmission and dark areas 115b indicate the absence of transmission. Notice that the transmission profile of the readout beam corresponds to the profile of the writing beam.

Figure 3:
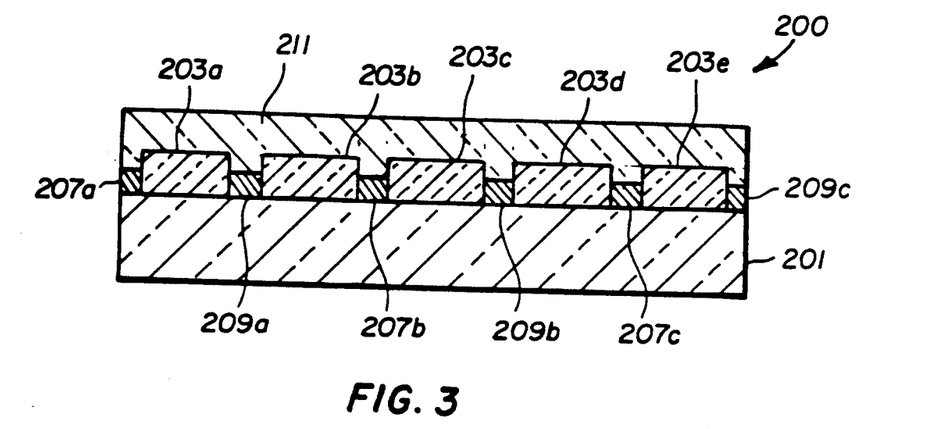
FIG. 3 is a sectional view similar to that of FIG. 2 showing an alternative photorefractive device according to the invention.

The functions performed by photorefractive device 100 can also be achieved with alternative device constructions. In FIG. 3, a device 200 is shown comprised of a transparent dielectric support 201 onto which is coated a photorefractive layer that has been divided into laterally spaced segments 203a, 203b, 203c, 203d and 203e. The dielectric support has a refractive index less than that of the photorefractive layer segments. Segments 207a, 207b and 207c of a first electrode and segments 209a, 209b and 209c of a second electrode form two interleaved sets of laterally spaced electrode segments, with one photorefractive layer segment being positioned between one segment of the first electrode and one segment of the second electrode. An optional protective dielectric transparent coating 211 completes the device. The operation of the device 200 is essentially the same as that of device 100. The transparent coating preferably has a refractive index lower than that of the photorefractive layer in the absence of an applied electrical field.

Figure 4:
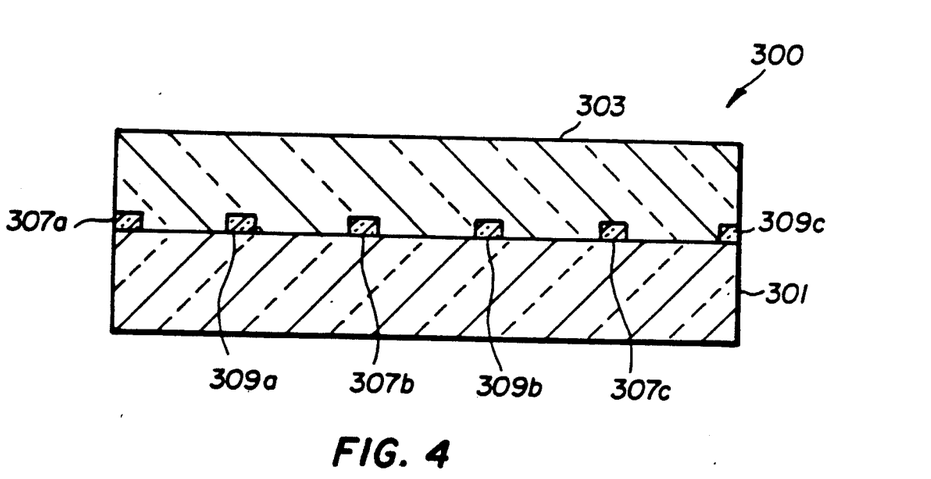
FIG. 4 is a sectional view similar to that of FIG. 2 showing an additional photorefractive device according to the invention.

In FIG. 4 a photorefractive device 300 is shown comprised of a transparent dielectric support 301. Located on the support are segments 307a, 307b and 307c of a first electrode and segments 309a, 309b and 309c of a second electrode forming two interleaved sets of electrode segments. The first and second electrode segments are each formed of a transparent conductive material, such as thin conductive metal or metal oxide layer. Overlying the electrodes is a photorefractive layer 303. The transparent support has a refractive index less than that of the photorefractive layer in the absence of an applied electrical field. The operation of device 300 is essentially similar to that of device 100.

Notice that by employing transparent (or nearly transparent) electrodes in the device 300 it is not necessary to employ a cladding layer to keep the electrodes out of direct contact with the photorefractive layer. This simplifies device construction.

While photorefractive devices 100, 200 and 300 illustrate varied forms of the invention, it is recognized that still other variations in construction are possible. For example, instead of dividing the first and second electrodes into two interleaved laterally spaced sets of segments as shown, it is recognized that a single first electrode and a single second electrode can be laterally spaced in each of the various device constructions. The purpose in employing laterally spaced interleaved sets of electrode segments is to reduce the magnitude of the applied potential difference required to achieve a local field gradient within the photorefractive layer.

In device 100 the cladding layer 105 can be omitted when the electrodes are formed of a transparent material. By comparing devices 100 and 300 it is apparent that the segments of the first electrode can be located on the support beneath the photorefractive layer while the segments of the second electrode are located either directly on the photorefractive layer when the electrode segments are transparent or, in any case, on a cladding layer. Since the photorefractive layer is usually much thinner than shown, displacement of adjacent first and second electrode segments remains predominantly lateral rather than vertical. When one electrode is located over and one electrode located beneath the photorefractive layer, the electrodes, whether or not segmented, can be vertically aligned. Vertical alignment is not preferred, since this is does not result in the most efficient orientation of the organic molecular dipoles within the photorefractive layer.

In FIG. 1 no coupling arrangement for introducing electromagnetic radiation into the photorefractive device 100 is shown. While no coupling arrangement is required, it most instances conventional coupling arrangements, such as prisms, gratings or end couplings, are likely to be employed for guiding the writing and reference beams into the photorefractive layer. A coupling surface can be provided merely by extending the support and photorefractive layer laterally beyond the electrodes and, optionally, the cladding layer.

The photorefractive devices of the invention all feature relatively simple constructions. The device 300 can be constructed by only two coating steps, only one of which requires patterning. Notice that in all of the devices the length and the width of are readily adaptable to either large or small area information transfer.

Although the photorefractive devices have utility in storing a single image pattern, it is recognized that it is possible to store multiple image patterns concurrently within a single device. After a first image pattern has been stored in the device, the angle of at least one of the writing and reference beams is varied. Repeating the information input process a second image pattern carried by the writing beam results in a second image being formed in the device. The first image can be read out by addressing the device at the original reference beam angle while the second image can be read out by addressing the device at the second reference beam angle.

From the foregoing discussion it is apparent that a common feature of all forms of the invention is a photorefractive layer that is both photoconductive and capable exhibiting a second order polarization susceptibility of greater than $10^{-9}$ esu under conditions of use. On reflection, other important characteristics can be recognized. For example, to avoid internally scattering electromagnetic radiation and thereby creating noise diminishing or obscuring image discrimination, it is an important feature of the invention that the photorefractive layer be homogeneous—that is, the photorefractive layer is constituted of a single phase. Homogeneous photorefractive layers can result from coating all the ingredients from a common solution and avoiding crystallization during solvent removal. By choosing organic materials, such as organic photoconductors including organic molecular dipoles, the problems of insolubility and crystallization characteristic of inorganic photoconductors and inorganic molecular dipoles can be avoided. The homogeneous photorefractive layers of this invention can be viewed as solid solutions. Stated another way, the photorefractive layer until addressed by electromagnetic radiation exhibits a single, uniform index of refraction.

The photorefractive layers incorporated in the devices of this invention are comprised of a homogeneous organic photoconductor containing organic noncentrosymmetric molecular dipoles capable of imparting to the photorefractive layer a second order polarization susceptibility of greater than $10^{-9}$ esu. As described above, the photoconduction property is required to alter locally the conductance of the photorefractive layer, thereby locally altering the space charge within the layer. Polar aligned organic molecular dipoles are required to alter locally the refractive index of the photorefractive layer in response to the alteration locally of the space charge.

Organic molecular dipoles are comprised of an electron donor moiety and an electron acceptor moiety linked through a conjugated $\pi$ bonding system. The organic molecular dipoles exhibit internal resonance and are commonly referred to as chromophores or dyes, since their internal resonance characteristics cause them to absorb radiation in the ultraviolet portion of the spectrum and, usually, depending on the $\pi$ bonding system, in at least a portion of the visible spectrum.

In the practice of the invention the electromagnetic radiation absorption capabilities of the organic molecular dipoles in themselves serve no useful purpose. To avoid having the writing, reference or reading beams absorbed by the organic molecular dipoles, the wavelengths of these addressing beams are chosen to avoid spectral regions in which the organic molecular dipoles exhibit significant absorption. Preferably the wavelengths of the addressing beams are chosen to fall in a spectral region within which absorption by the organic molecular dipoles is less than 0.1 its maximum absorption. In other words, the addressing beams address the device in a spectral region in which the organic molecular dipoles exhibit an optical density of less than 0.1 of their peak optical density.

Fortunately, the most common and efficient organic molecular dipoles absorb in the ultraviolet and the visible portion of the spectrum, typically exhibiting peak absorptions at wavelengths less than 600 nm. This leaves large regions of the spectrum available for addressing the photorefractive devices. It is usually preferred to address the devices of this invention with electromagnetic radiation that is bathochromically shifted in wavelength as compared to the absorption of the organic molecular dipoles. The addressing radiation can conveniently be near infrared radiation in the wavelength range of from about 700 to 2,000 nm or, depending upon the choice of organic molecular dipoles, visible radiation, preferably in the 550 to 700 nm portion of the visible spectrum. The devices of the invention particularly lend themselves to laser addressing. Longer wavelength visible and infrared radiation can be conveniently supplied by solid state semiconductor lasers.

The photorefractive layer must be sufficiently transmissive of the writing and reference beams to permit an interference pattern to be internally generated. However, if the photorefractive layer were completely transparent, it would not be photoconductive, since locally altering layer conductance depends on absorbing a photon to liberate a mobile charge, either a hole or an electron, that is then employed as a charge carrier for conductance. Therefore, the organic photoconductor must be chosen to absorb some portion of the writing and reference beams.

In one form, the photorefractive layers of the devices of this invention consist of an organic photoconductor comprised of
 (a) a sensitizer,
 (b) a charge transporting agent,
 (c) a binder and
 (d) an organic molecular dipole.

The function of the sensitizer is to capture a photon supplied by the internally generated interference pattern and to supply a mobile charge to the charge transporting agent. It is recognized that some charge transporting agents are themselves capable of photon capture and can be used without a sensitizer; however, the efficiency of photon capture usually suffers when a sensitizer is not provided. The function of the binder is simply to facilitate forming solid layers. The organic molecular dipoles can be a separate component of the organic photoconductor or, preferably, the organic molecular dipoles can be provided as moieties of a polymer. In this latter instance it is possible to proportionately reduce or eliminate entirely the binder as a separate component. In some instances the organic molecular dipole polymers exhibit sufficient charge transporting capabilities that a separate charge transporting agent need not be employed. It is also recognized that the charge transport agent can itself be a polymer, allowing the binder to be reduced or eliminated. The most efficient systems contain components (a), (b), (c) and (d) or components (a), (b) and (d), where the binder function is additionally provided by (d).

From the prior discussion of device constructions, it is apparent that the addressing beams travel laterally through the photorefractive layer rather than penetrating normally, as photoconductive layers are conventionally addressed in electrophotography. Thus, the length of the propagation path of the addressing beams in the photorefractive layer is many times that typical of electrophotography. This in turn means that the organic photoconductors employed in the practice of this invention can achieve the absorption efficiencies of conventional electrophotographic layers with much lower concentrations of photon absorbers.

These observations provide an explanation for the discovery that extremely low levels of sensitizers are useful and that sensitizers that might otherwise have been thought incompatible with achieving a homogeneous (single phase) photorefractive layer can be employed. Sensitizer concentrations measured in parts per million on a basis of total weight of the photorefractive layer (i.e., as low as $10^{-6}$) are contemplated. Even the more inefficient sensitizers can be employed at concentrations down to about $10^{-5}$ on a total weight basis. The maximum permissible sensitizer concentrations are those typical of electrophotography, with maximum concentrations ranging up to 50 percent, preferably up to 20 percent, and optimally up to 15 percent, based on total layer weight.

The recognition that lateral addressing of the photorefractive layer allows extremely low levels of sensitizer to be effective also leads to the recognition that all but the most insoluble of sensitizers are compatible with preparing the single phase photorefractive layers of this invention. In other words, sensitizers having solubilities in the range of from about $10^{-4}$ or $10^{-3}$ to 1 percent by weight, based on total layer weight, including those typically employed in electrophotography as dispersed particles, are fully compatible with the practice of this invention.

Useful sensitizing compounds can be selected from a wide variety of materials, including such materials as pyrylium dye salts (including simple pyrylium, thiapyrylium, selenapyrylium and tellurapyrylium dyes and their analogues having fused benzo rings—e.g., flavylium dyes), specific examples being disclosed in Van Allan et al U.S. Pat. No. 3,250,615, and various other dyes, such as cyanine (including carbo- and dicarbo-cyanine), merocyanine, diarylmethane, thiazine, azine, oxazine, xanthene, phthalein, acridine, azo, anthraquinone and similar dyes. Illustrative sensitizers and sensitizer combinations are also disclosed in the various patents and publications cited below to illustrate charge transporting agents. Preferred sensitizers are 3,4,9,10-perylene dicarboximides, particularly N,N'-diphenyl substituted dicarboximides of perylene which are further substituted with solubility modifying substituents, such as alkyl and alkoxy phenyl ring substituents of from 1 to 6 carbon atoms.

When the sensitizer captures a photon, a valence electron is promoted to a higher energy level, leaving a vacancy (hole) at its original energy level. To translate this event into increased local conductance it is necessary to have a charge transporting agent present capable of facilitating migration of either the electron or hole in the applied electric field. Useful charge transporting agents can be chosen from among those commonly employed in electrophotography.

Organic hole transporting agents include arylamines of the type disclosed in Fox U.S. Pat. No. 3,240,597 and Klupfel et al U.S. Pat. No. 3,180,730; polyarylalkane photoconductors of the type disclosed in Noe et al U.S. Pat. No. 3,274,000, Fox U.S. Pat. No. 3,240,597, Wilson U.S. Pat. No. 3,542,547, Rule U.S. Pat. No. 3,615,402 and Berwick et al U.S. Pat. No. 4,127,412; 4-diarylamino-substituted chalcones of the type disclosed in Fox U.S. Pat. No. 3,615,402; non-ionic cycloheptenyl compounds of the type disclosed in Locker U.S. Pat. No. 3,533,786; hydrazine nucleus compounds of the type described in Fox U.S. Pat. No. 3,542,546; organic compounds having a 3,3'-bis-aryl-2-pyrazoline nucleus of the type described in Fox et al U.S. Pat. No. 3,527,602; triarylamines in which at least one of the aryl radicals is substituted by either a vinyl radical or a vinylene radical having at least one active hydrogen-containing group of the type described in Brantly et al U.S. Pat. No. 3,567,450; triarylamines in which at least one of the aryl radicals is substituted by an active hydrogen containing group of the type described in Brantly et al U.S. Pat. No. 3,658,520 and Belgian Patent No. 728,563, issued Mar. 2, 1971; carbazoles, including carbazole, N-ethylcarbazole, N-isopropylcarbazole, N-phenylcarbazole, halogenated carbazoles and bis(carbazolylalkanes); tetraarylbenzidines, such as tetra-p-tolylbenzidine, N,N'-bis(3-methylphenyl)-[1,1'-biphenyl]-4,4'-diamine and other tetraaryl benzidines described in Tsai U.S. Pat. No. 4,265,402, Horgan U.S. Pat. No. 4,047,949 and Pai et al U.S. Pat. No. 4,346,158; hydrazones, including the diphenyl hydrazones of dialkyl-substituted aminobenzaldehyde of Anderson et al U.S. Pat. No. 4,150,987, alkyl hydrazones and aryl hydrazones of the type described in Peterson U.S. Pat. No. 4,544,231, Isikawa et al U.S. Pat. No. 4,487,824, Fukagai et al U.S. Pat. No. 4,481,271, Fujimura et al U.S. Pat. No. 4,456,671, Heater U.S. Pat. No. 4,446,271 and Isikawa et al U.S. Pat. No. 4,423,129; organo-metallic compounds having at least one amino-aryl substituent attached to a Group IVa or Group Va metal atom of the type described in Goldman et al Canadian Patent No. 818,539, issued July 22, 1969; and organo-metallic compounds having at least one aminoaryl substituent attached to a Group IIIa metal atom of the type described in Johnson Belgian Patent No. 735,334 issued Aug. 29, 1969. These and still other varied types of useful hole transporting agents are set forth in Research Disclosure, Vol. 109, May 1973, Item 10930. Research Disclosure (hereinafter RD) is published by Kenneth Mason Publications, Ltd., Dudley Annex, 21a North St., Emsworth, Hampshire P010 7DQ, England. RD Item 10930 as well as the patents cited above in this paragraph are incorporated by reference.

Polymeric hole transporting agents are specifically contemplated, such as polymers containing carbazole or a halogenated carbazole, a condensation polymer of formaldehyde and a polynuclear aromatic monomer such as described in U.S. Pat. No. 3,240,597, a polymer containing an aromatic amine moiety such as described in Brantley et al U.S. Pat. No. 3,779,750, Turner et al U.S. Pat. No. 4,714,779 and by Stolka et al, Journal of Polymer Science, Polymer Chemistry Edition, Vol. 21, pp. 969-983 (1983) and substituted poly(silylenes), such as those disclosed by Abkowitz et al, Philosophical Magazine B, Vol. 61, No. 1, pp. 25-27 (1990).

Electron transporting agents of a variety of forms are also known to the art. Regensburger U.S. Pat. No. 3,928,034 teaches selection of useful electron transporting agents from among phthalic anhydride, tetrachlorophthalic anhydride, benzil, mellitic anhydride, S-tricyanobenzene, picryl chloride, 2,4-dinitrochlorobenzene, 2,4-dinitrobromobenzene, 4-nitrobiphenyl, 4,4'-dinitrobiphenyl, 2,4,6-trinitroanisole, trichlorotrinitrobenzene, p-dinitrobenzene, chloranil, bromanil and mixtures thereof. Ong et al U.S. Pat. Nos. 4,474,865, 4,546,059, 4,562,132 and 4,609,602 disclose the utility of various strong electron withdrawing group di-substituted 9-fluorenylidenemethanes, 10-anthronylidenemethanes and bisanthraquinodimethanes as electron transporting agents. Scozzafava et al U.S. Pat. No. 4,514,481 discloses 4H-thiopyran-1,1-dioxides having an electron withdrawing group at the 4 position to be useful electron transporting agents. Japanese Kokai Nos. 63/173,388 and 63/174,993 (priority 13/01/87) disclose dicyano derivatives of benzophenones that are 4-dimesitylboron substituted to be useful electron transferring agents. Kung et al U.S. Pat. Nos. 4,869,984 and '985 disclose novel naphthoquinone derivatives in which one or both of the oxo groups are replaced with an imino nitrogen that is in turn substituted with a strong electron withdrawing group, such as a cyano group, to the useful electron transporting agents. The disclosures of each of these teachings are here incorporated by reference.

A wide variety of conventional common nonionic vinyl and condensation polymeric binders are useful in the photorefractive layers. A catalogue of useful, early recognized binders is provided by Desauer and Clark, *Xerography and Related Processes*, Focal Press Ltd., 1965, at page 165, here incorporated by reference. Preferred binders are film forming polymers that are electrically insulating and exhibit sufficient dielectric strength to withstand applied potential gradients. Such binders include, for example, styrene-butadiene copolymers; vinyl toluene-styrene copolymers; styrene-alkyd resins; silicone-alkyl resins; soya-alkyd resins; vinylidene chloride-vinyl chloride copolymers; poly(vinylidene chloride); vinylidene chloride-acrylonitrile copolymers; vinyl acetate-vinyl chloride copolymers; poly(vinylacetals), such as poly(vinyl butyral); nitrated polystyrene; poly(methylstyrene); isobutylene polymers; polyesters, such as poly[ethylene-co-alkylenebis-(alkyleneoxyaryl)phenylene dicarboxylate]; phenolformaldehyde resins; ketone resins; polyamides; polycarbonates; polythiocarbonates; poly[ethylene-co-isopropylidene-2,2-bis(ethyleneoxyphenylene)terephthalate]; copolymers of vinyl haloacrylates and vinyl acetate such as pol(vinyl-m-bromobenzoate-co-vinyl acetate); chlorinated poly(olefins), such as chlorinated poly(ethylene); and polyimides, such as poly[1,1,3-trimethyl-3-(4'-phenyl)-5-indane pyromellitimide].

Binder polymers are preferred which provide little or no interference with the generation or transport of charge. Examples of binder polymers which are especially useful include bisphenol A polycarbonates and polyesters such as poly[4,4'-(2-norbornylidene)diphenylene terephthalate-co-azelate].

To achieve sufficient local differences in refractive indices within the photorefractive layer it is necessary that this layer exhibit a second order polarization susceptibility, $\chi^{(2)}$, of greater than $10^{-9}$ electrostatic units under the conditions of use. This is accomplished by incorporating organic molecular dipoles in the photorefractive layer and polar aligning the organic molecular dipoles. Polar alignment can be achieved by poling, described in more detail below. Since the devices of this invention can be built and sold without poling, allowing the user to undertake poling, the photorefractive layer in commercial devices need only have the capability of achieving a second order polarization susceptibility of greater than $10^{-9}$ esu. This level of second order polarization susceptibility can be realized when the organic molecular dipoles exhibit a second order polarizability, $\beta$, greater than $10^{-30}$ esu.

The organic molecular dipoles each contain an electron donor moiety linked through a conjugated $\pi$ bonding system to an electron acceptor moiety to permit resonance of the molecular dipole between a lower polarity ground state and a higher polarity excited state. Typical electron acceptor moieties include oxo, cyano, nitro, sulfonyl and sulfonimino moieties. Typical electro donor moieties include primary, secondary and tertiary amino moieties. Preferred conjugated $\pi$ bonding systems are 4,4'-stilbene and 4,4'-diazostilbene linking moieties. 4-Amino-4'-(oxo, cyano, nitro or sulfonyl)stilbenes and diazostilbenes constitute specifically preferred organic molecular dipoles. Linking moieties consisting of a single carbocyclic or heterocyclic ring or extended conjugated vinyl chains are possible.

The organic molecular dipoles can be individually present as separate molecules or the organic molecular dipoles can be pendant or backbone repeating units of a polymer molecule. Ulman et al, cited above, discloses organic molecular dipoles having sulfonyl and sulfonimino electron acceptor moieties in various of the monomeric and polymeric forms described above. Scozzafava et al U.S. Pat. No. 4,886,339, here incorporated by reference, discloses the polar alignment of monomeric organic molecular dipoles within a crosslinked polymeric binder. Robello et al U.S. Pat. No. 4,796,971, here incorporated by reference, discloses organic molecular dipoles as pendant groups in crosslinked polymeric binder. Robello et al European Patent Application No. 0,313,477, published Apr. 31, 1989, here incorporated by reference, discloses organic molecular dipoles forming backbone repeating units in condensation polymers. When the organic molecular dipole molecules are themselves polymers, as is preferred, the use of a separate binder component can be eliminated or reduced.

It is generally preferred to incorporate the maximum concentration of the organic molecular dipole component in the photorefractive layer that is compatible with retaining adequate photoconductivity, thereby optimizing the second order polarization susceptibility of the photorefractive layer. When the organic molecular dipole makes no contribution to charge transport, the charge transporting agent is typically present in a concentration ranging from about 5 to 50 percent, preferably 20 to 40 percent, by weight, based on the total weight of the photorefractive layer. As demonstrated in the examples below, the organic molecular dipole polymers are capable of acting as the sole charge transporting agent. In this instance no separate charge transporting agent is required.

The photorefractive layers of the device of this invention are contemplated to range in thickness from 0.2 to 100 $\mu$m, preferably from 0.5 to 10 $\mu$m. Increasing the thickness of the photorefractive layer does not detract from device performance, but is not preferred, since layer thickness increments contribute little to device performance. The minimum layer thicknesses are chosen on the basis of the ease of obtaining a uniform coating.

The photorefractive layers require poling to achieve the polar alignment of molecular dipoles required for realizing a second order polarization susceptibility of at least $10^{-9}$ esu. One approach to poling is to prepare the device with the organic photoconductor composition described above coated as an unpoled precursor of the photorefractive layer. With an electric field applied to the electrodes the device is heated above the glass transition temperature of the binder so that the organic molecular dipoles are allowed to orient themselves in polar alignment with the applied field. The device is then allowed to cool below the glass transition temperature of the binder with the field still applied. This immobilizes the organic molecular dipoles in their polar aligned orientation. When the organic molecular dipoles serve both that function and that of binder, the device is heated above the glass transition temperature of the organic molecular dipole polymer. In another form, instead of depending upon cooling below the glass transition temperature to immobilize the organic molecular dipoles in polar alignment, photopolymerization or crosslinking of either the organic molecular dipoles or a separate binder can be relied upon to immobilize the organic molecular dipoles in their polar aligned orientation with the electric field applied. All of the above poling techniques are conventional and are disclosed in the patents cited above pertaining to organic molecular dipoles.

Since a dc electric field is often applied to the electrodes for an extended period during poling, the components of the photorefractive layer are chosen so that the photorefractive layer remains homogenous. Concentration of a component adjacent one of the electrodes can be avoided by employing compounds that are charge neutral (that is, nonionic or zwitterionic) or which, though anionic or cationic, exhibit sufficient molecular bulk to impede their mobility. For example, a polymer containing an acrylic acid repeating unit, though anionically charged, has the molecular bulk to remain immobile during poling. In almost every instance zwitterionic analogues of the lower molecular weight anionic and cationic organic photoconductor components are known to exist or can be readily synthesized for use in the practice of this invention.

The electrodes can take any convenient conventional form. The transparent electrodes can take the form a very thin metal or metal oxide layer. Indium tin oxide is a commonly employed preferred transparent electrode material. Useful electrode constructions can be selected from among those employed in electrophotography. The electrodes can, if desired, be formed of both a conductive portion and a buffer layer (including a cladding layer) to limit unwanted interactions with the photorefractive layer, such as charge injection.

The transparent supports 101, 102 and 103 preferably formed of glass. A wide variety of transparent glasses are known that satisfy refractive index requirements. In alternative support construction, not shown, the support can be opaque with a transparent layer coated on its upper surface. For example, the support can be a glass coating on ceramic, semiconductor or metal substrate. Instead of employing a glass coating, the coating can take the form of any of the cladding layers described below.

The cladding layer 105 offers a more limited choice of materials than the underlying transparent support, since it must be capable of being coated on the organic photoconductor forming the photorefractive layer and must also be sufficiently stable to withstand elevated poling temperatures, if employed. When poling is undertaken at ambient or near ambient temperatures, the cladding layer 105 can be formed of almost any convenient organic polymer. When poling is undertaken at elevated temperatures above the glass transition temperature of the polymeric binder or molecular dipole forming the photorefractive layer, the cladding layer must itself have a still higher glass transition temperature.

One preferred cladding layer compatible with poling at elevated temperatures is formed of an alkaline earth metal halide. Magnesium fluoride is specifically preferred. It is also possible to employ a combination of an alkaline earth metal halide, preferably magnesium fluoride, and an organic aromatic compound having a molecular weight of less than about 1000 and a glass transition temperature of at least 50° C. Cladding layers of these compositions can be formed by vacuum vapor deposition. These cladding layers can be conveniently formed within the thickness range of from about 0.5 to 10 μm. Phenylindans are particularly preferred. Where poling is conducted at ambient or near ambient temperatures the organic aromatic compounds can be employed alone to form cladding layers. These cladding layers are discussed in more detail in Schildkraut et al U.S. Ser. No. 419,817, Scozzafava et al U.S. Ser. Nos. 419,818 and 419,819, and Rider et al U.S. Ser. No. 419,984, all filed Oct. 11, 1989, and commonly assigned.

EXAMPLES

The invention can be better appreciated by reference to the following specific embodiments. In all instances quantum efficiency is measured at the initial electric field strength.

EXAMPLE 1

To 3 mL of 1,2,3-trichloropropane were added 450 mg of an organic molecular dipole polymer identified in the APPENDIX as Polymer B, 20 mg of the sensitizer N,N'-bis(2,5-di-tert-butylphenyl)-3,4,9,10-perylenedicarboximide, and 20 mg of hole transporting agent 1,1-bis(4-di-p-tolyaminophenyl)cyclohexane. The solution was spin coated on a 25.8 cm$^2$ soda-lime glass plate covered with 30 nm of indium thin oxide (ITO) as follows: First, the substrate was completely covered with the solution. Next, the substrate was spun at 500 rpm for 10 sec and subsequently at 2,000 rpm for 1 minute. The film was then baked at 110° C. for 16 hours at a pressure of 25 mtorr. The composition of the film based on weight was 91.8% organic molecular dipole polymer, 4.1% sensitizer and 4.1% hole transporting agent. The film thickness was approximately 1.5 μm.

Photoconduction was demonstrated by corona charging the film to +326 volts. At this voltage the dark decay rate was 3.6 volt/sec. When exposed to 63 ergs/cm$^2$-sec of 515 nm light the voltage decreased to 163 volts in 8.1 sec and 62.2 volts in 37.6 sec. The quantum efficiency of photocharge generation was 0.038.

In order to bring the organic molecular dipoles into polar alignment the film was corona poled in the dark at 220 volts and 98° C. for 16 hours. The corona charge was positive; the ITO was grounded. Finally, half of the film was covered with 1 μm of an evaporated phenylindan film and then the whole film was covered with several gold electrodes with an area of 0.1 cm$^2$. The specific phenylindan is identified in the APPENDIX as Phenylindan A.

The electrooptic effect in the polymer film was probed with a 632.8 nm beam of a HeNe laser as follows: A 632.8 nm beam polarized at 45° with respect to the plane of incidence was passed through the ITO electrode and polymer film and reflected from the gold electrode at an angle of incidence of 68°. The light beam was then passed through a quarter-wave plate and a polarizer which was oriented at 90° C. with respect to the first polarizer. The light passed by the second polarizer illuminated a photodetector. When a 1 kHz 75.2 V rms voltage was applied between the gold and ITO in a region without phenylindan an electrooptic modulation in light intensity on the photodetector was observed. From this the second order polarization susceptablity was calculated to be about $5 \times 10^{-8}$ esu.

A photorefractive effect was demonstrated as follows: A 5 Hz 130 volt rms voltage was applied between the gold and ITO electrodes in a region with the phenylindan cladding layer. The voltage changed the index of refraction of the polymer film via the electro-optic effect arising from the polar aligned organic molecular dipoles. The refractive index variation was observed as an intensity variation of the 632 nm laser beam. When a 514.5 nm beam of an Argon ion laser with a power of 7.4 mw and an area of 0.1 cm$^2$ was incident upon the polymer film, hole-electron pairs were created by the sensitizer. The electrons and holes drifted apart at an accelerated rate because of the applied field. This resulted in a space charge that decreased the intensity variation of the 632 nm beam by 11%. This creation of a space charge by photocharge generation and conduction in the electro-optic material was a demonstration of a photorefractive effect.

EXAMPLE 2

To 2 mL of 1,2,3-trichloropropane were added 200 mg of an organic molecular dipole polymer identified in the APPENDIX as Polymer D and 29 mg of the sensitizer N,N'-bis(2,5-di-tert-butylphenyl)-3,4,9,10-perylenedicarboximide. The film was spin coated on ITO-covered glass and baked at 120° C. at a pressure of 25 mtorr for 16 hours. The film composition was 87% polymer and 13% sensitizer. The film was corona charged to +116 volts. At this voltage the dark decay rate was 1.8 volt/sec. When exposed to 75 ergs/cm$^2$-sec of 480 nm light the voltage decreased to 58 volts in 17.7 sec. The quantum efficiency of photocharge generation was 0.0037. The second order polarization susceptibility of the film was estimated to be about $1.7 \times 10^{-8}$ esu.

EXAMPLE 3

To 2 mL of 1,2,3-trichloropropane were added 200 mg of Polymer D, the sensitizer N,N'-bis(2,5-di-tert-butylphenyl)-3,4,9,10-perylenedicarboximide in the amount of 28 mg and 33 mg of the hole transporting agent 1,1-bis(4-di-p-tolylaminophenyl)cyclohexane. The film was spin coated on ITO-covered glass and baked at 120° C. at a pressure of 25 mtorr for 16 hours. The film composition was 76% polymer, 11% sensitizer and 13% hole transporting agent. The film was corona charged to +122 volts. At this voltage the dark decay rate was 2.4 volt/sec. When exposed to 75 ergs/cm$^2$-sec of 480 nm light, the voltage decreased to 61 volts in 11.5 sec. The quantum efficiency of photocharge generation was 0.075. The second order polarization susceptibility was estimated to be about $1.5 \times 10^{-8}$ esu.

EXAMPLE 4

To 2.5 mL of 1,2,3-trichloropropane were added 360 mg of Polymer C and 7.2 mg of the pyrylium dye Flavylium Dye A identified in the APPENDIX. The film was spin coated on ITO-covered glass and baked at 120° C. at a pressure of 25 mtorr for 16 hours. The film composition was 98% polymer and 2% sensitizer. The film was corona charged to +200 volts at room temperature. The dark decay was 0.8 volts/sec. When exposed to 6 mW/cm$^2$ of light from a tungsten lamp the decay rate was 28 volt/sec. The film was heated to 92° C. and poled at 130 volts. The second order polarization susceptibility was estimated to be about $1 \times 10^{-7}$ esu.

EXAMPLE 5

To 2.5 mL of 1,2,3-trichloropropane were added 360 mg of Polymer A and 10.6 mg of the sensitizer 4,4'-bis(5,7-di-pentyl-2-benzoxazolyl)stilbene. The film was spin coated on ITO-covered glass and baked at 114° C. at a pressure of 25 mtorr for 16 hours. The film composition was 97% polymer and 3% sensitizer. The film was corona charged to +295 volts at room temperature. When exposed to 6 mW/cm$^2$ of light from a tungsten lamp photodischarge was observed. The film was heated to 92° C. and poled at 240 volts. The second order polarization susceptibility was estimated to be about $1 \times 10^{-8}$ esu.

EXAMPLE 6

To 2.5 mL of 1,2,3-trichloropropane were added 360 mg of Polymer A and 11.4 mg of the sensitizer N,N'-bis(2,5-di-tert-butylphenyl)-3,4,9,10-perylene-dicarboximide. The film was spin coated on ITO-covered glass and baked at 114° C. at a pressure of 25 mtorr for 16 hours. The film composition was 97% polymer and 3% sensitizer. The film was corona charged to +170 volts at room temperature. When exposed to 6 mW/cm$^2$ of light from a tungsten lamp photodischarge was observed. The film was heated to 100° C. and poled at 170 volts. The second order polarization susceptibility was estimated to be about $1 \times 10^{-8}$ esu.

APPENDIX

| | y/(y + z) | X | Tg(°C.) | $M_n$(GPC)* |
|---|---|---|---|---|
| Polymer A | 0.19 | O | 116 | 36,000 |
| Polymer B | 0.16 | —N(CH$_3$)— | 123 | 28,000 |

*Number average molecular weight as measured by gel permeation chromatography (GPC). A molecular weight determination procedure of this type is described in detail in "Modern Size Exclusion Chromatography", W. W. Yau, J. J. Kirkland, and D. D. Bly, Wiley Interscience, J. Wiley and Sons, 1979.

Polymer C $\frac{m}{m + n} = 0.15$

Tg = 109° C.

$M_n$(GPC) = 34,000

Polymer D

$\frac{m}{m + n} = 0.11$

Tg = 127° C.

$M_n$(GPC) = 41,000

Flavylium Dye A

APPENDIX-continued

Phenylindan A

R = —NHC(O)—⟨ ⟩

The invention has been described in detail with particular reference to preferred embodiments thereof, but it will be understood that variations and modifications can be effected within the spirit and scope of the invention.

What is claimed is:

1. A photorefractive device comprised of
   first and second electrical biasing means for establishing a potential gradient between first and second spaced locations and, interposed between said first and second electrical biasing means,
   intermediate means capable of producing in a readout beam of electromagnetic radiation an image pattern corresponding to that present in a spatially intersecting writing beam of electromagnetic radiation when a potential gradient is applied to said intermediate means by said first and second electrical biasing means,
   characterized in that said intermediate means consists of a photorefractive layer capable of internally storing the image pattern of the writing beam created by its interference with an intersecting reference beam of electromagnetic radiation, said photorefractive layer being comprised of a homogeneous charge neutral organic photoconductor containing organic noncentrosymmetric molecular dipoles capable of imparting to said photorefractive layer a second order polarization susceptibility of greater than $10^{-9}$ esu, said molecular dipoles each containing an electron donor moiety linked through a conjugated $\pi$ bonding system to an electron acceptor moiety.

2. A photorefractive device according to claim 1 further characterized in that said photorefractive layer is coated on a transparent support having a lower refractive index than said photorefractive layer and said first and second electrodes are located at laterally displaced locations along said photorefractive layer.

3. A photorefractive device according to claim 2 further characterized in that a transparent dielectric cladding layer having a refractive index less than that of said photorefractive layer overlies said photorefractive layer.

4. A photorefractive device according to claim 3 further characterized in that said first and second electrodes are located on said cladding layer.

5. A photorefractive device according to claim 2 further characterized that said first and second electrodes are located on said transparent support.

6. A photorefractive device according to claim 5 further characterized in that said first and second electrodes are transparent.

7. A photorefractive device according to claim 2 further characterized in that said first electrode is comprised of a plurality of laterally spaced segments and said second electrode is comprised of a plurality of laterally spaced segments, one segment of said second electrode being located between and laterally spaced from each segment of said first electrode.

8. A photorefractive device according to claim 7 further characterized in that said photorefractive layer is comprised of a plurality of segments, each segment of said photorefractive layer being interposed between adjacent segments of said first and second electrodes.

9. A photorefractive device according to claim 7 further characterized in that said segments of said first and second electrodes form two interlaid sets of parallel conductive strips.

10. A photorefractive device according to claim 1 further characterized in that said organic molecular dipoles exhibit a second order polarizability of greater than $1 \times 10^{-30}$ electrostatic units.

11. A photorefractive device according to claim 1 further characterized in that said electron donor and electron acceptor moieties of said organic molecular dipoles are linked through a 4,4'-stilbene or diazostilbene conjugated $\pi$ bonding system.

12. A photorefractive device according to claim 10 further characterized in that said electron donor moiety is an amine.

13. A photorefractive device according to claim 10 further characterized in that said electron acceptor moiety is chosen from the class consisting of oxo, cyano, nitro and sulfonyl electron acceptor moieties.

14. A photorefractive device according to claim 1 further characterized in that said organic photoconductor includes a soluble sensitizer capable of absorbing radiation from a second source in a spectral region within which said organic molecular dipoles have an optical density of less than 0.1.

15. A photorefractive device according to claim 14 further characterized in that said soluble sensitizer is a pyrylium dye.

16. A photorefractive device according to claim 14 further characterized in that said soluble sensitizer is a perylene dye.

17. A photorefractive device according to claim 1 further characterized in that said organic photoconductor includes a charge transporting agent.

18. A photorefractive device according to claim 17 further characterized in that said charge transporting agent is a hole transporting agent.

19. A photorefractive device according to claim 17 further characterized in that said charge transporting agent is an electron transporting agent.

20. A photorefractive device according to claim 1 further characterized in that said organic photoconductor includes a polymeric binder.

21. A photorefractive device according to claim 20 further characterized in that said organic molecular dipoles are covalently bonded to said polymeric binder.

22. A photorefractive device according to claim 21 further characterized in that said organic molecular dipoles are pendant groups attached to said polymeric binder.

23. A photorefractive device according to claim 17 further characterized in that said charge transporting agent is a polymeric binder.

24. A process of transferring information from one source of electromagnetic radiation to another comprising transferring information contained in a modulated source of electromagnetic radiation to a photorefractive device and addressing the photorefractive device with a source of electromagnetic radiation to be modulated in order to achieve information transfer from the modulated source of electromagentic radiation to the source of radiation to be modulated, characterized in that the photorefractive device is constructed according to claim 1.

* * * * *